(12) United States Patent
Arashima et al.

(10) Patent No.: US 7,413,589 B2
(45) Date of Patent: Aug. 19, 2008

(54) METHOD OF PRODUCING HYDROGEN STORAGE ALLOY

(75) Inventors: Hironobu Arashima, Muroran (JP); Takashi Ebisawa, Muroran (JP); Hideaki Itoh, Muroran (JP)

(73) Assignee: The Japan Steel Works, Ltd., Tokyo (JP)

( * ) Notice: Subject to any disclaimer, the term of this patent is extended or adjusted under 35 U.S.C. 154(b) by 327 days.

(21) Appl. No.: 11/235,185

(22) Filed: Sep. 27, 2005

(65) Prior Publication Data

US 2006/0027041 A1 Feb. 9, 2006

Related U.S. Application Data

(62) Division of application No. 10/394,274, filed on Mar. 24, 2003.

(30) Foreign Application Priority Data

Mar. 22, 2002 (JP) ............................. P2002-80199

(51) Int. Cl.
*C22C 1/02* (2006.01)
*C22B 4/06* (2006.01)

(52) U.S. Cl. ...................... 75/10.11; 420/900; 420/590; 148/538

(58) Field of Classification Search ................. 420/590, 420/900; 75/10.11; 148/538
See application file for complete search history.

(56) References Cited

U.S. PATENT DOCUMENTS

| 4,643,874 | A | * | 2/1987 | Fichte et al. ................. 420/417 |
| 4,948,423 | A | | 8/1990 | Fetcenko et al. |
| 5,076,341 | A | | 12/1991 | Noguchi |
| 5,968,291 | A | | 10/1999 | Iba et al. |
| 6,153,032 | A | | 11/2000 | Iba et al. |
| 6,210,478 | B1 | * | 4/2001 | Bewlay et al. ................. 117/37 |
| 6,258,184 | B1 | | 7/2001 | Iba et al. |
| 6,740,448 | B2 | * | 5/2004 | Fetcenko et al. .......... 429/218.1 |
| 7,073,558 | B1 | * | 7/2006 | Nakajima ................... 164/66.1 |
| 2001/0003997 | A1 | * | 6/2001 | Fetcenko et al. ............ 148/442 |

(Continued)

FOREIGN PATENT DOCUMENTS

DE 199 16 614 A1 12/1999

(Continued)

OTHER PUBLICATIONS

Martynova et al. "Electrical resistvitiy studies of Cr-Ir alloy single crystals." J. Phys: Condens. Matter 8 (1996) pp. 10473-10481.*

(Continued)

*Primary Examiner*—Roy King
*Assistant Examiner*—Tima M McGuthry-Banks
(74) *Attorney, Agent, or Firm*—Sughrue Mion, PLLC

(57) ABSTRACT

A melt of a hydrogen storage alloy having an arbitrary composition is cooled gradually at a cooling rate of 5° C./min or less and solidified. Alternatively an alloy having an arbitrary composition, after heating to a temperature equal to or more than a melting point thereof, is cooled gradually at a cooling rate of 5° C./min or less and solidified. Thereby a homogeneous alloy reduced in segregation, precipitates, or inclusions is obtained. The homogeneous alloy is excellent in the hydrogen storage amount, in the plateau property and in durability.

4 Claims, 4 Drawing Sheets

U.S. PATENT DOCUMENTS

2006/0027041 A1  2/2006  Arashima et al.

FOREIGN PATENT DOCUMENTS

| EP | 0 595 477 A1 | | 5/1994 |
|---|---|---|---|
| JP | 03-230860 A | | 10/1991 |
| JP | 5-114403 A | | 5/1993 |
| JP | 06057358 A | * | 3/1994 |
| JP | 6-122585 A | | 5/1994 |
| JP | 6-163039 A | | 6/1994 |
| JP | 7-89745 A | | 4/1995 |
| JP | 7-252560 | | 10/1995 |
| JP | 9-69362 A | | 3/1997 |
| JP | 10-245663 | | 9/1998 |
| JP | 11-92271 A | | 4/1999 |

OTHER PUBLICATIONS

Machine translation and English abstract of JP 10-245663 A, published Sep. 14, 1998.*

Machine Translation of JP 06057358. Published 1994.*

Machine Translation of JP 05114403. Published 1993.*

German Office Action for Germant Patent Application No. 103 13 037.3-43 dated Jun. 24, 2005.

Arashima et al., "P-T characteristic of BCC alloy with repetition of hydrogen absorption and release cycle", reported to the Japanese Metal Academy, Autumn 1999.

Arashima et al., "Analysis of factor influence to durability of solid solution type hydrogen storage alloy", reported to the Japanese Metal Academy, Autumn 2000.

T. Kabutomori, et al.; Hydrogen Absorption Properties of Ti-Cr-A (A ≡ V, Mo or other transition metal) B.C.C. solid solution alloys; Journal of Alloys and Compounds 231 (1995) 528-532.

USPTO Translation of JP 05-114403 "Hydrogen Storage Alloy Electrode and Method for Manufacturing the Same".

ASM Handbook, vol. 11, "Failure and Analysis Prevention", 2002, printed from electronic handbook on Dec. 15, 2006.

* cited by examiner

DIFFERENCE OF VANADIUM CONCENTRATION 1.5wt%

100μm

DIFFERENCE OF VANADIUM CONCENTRATION 4wt%

100μm

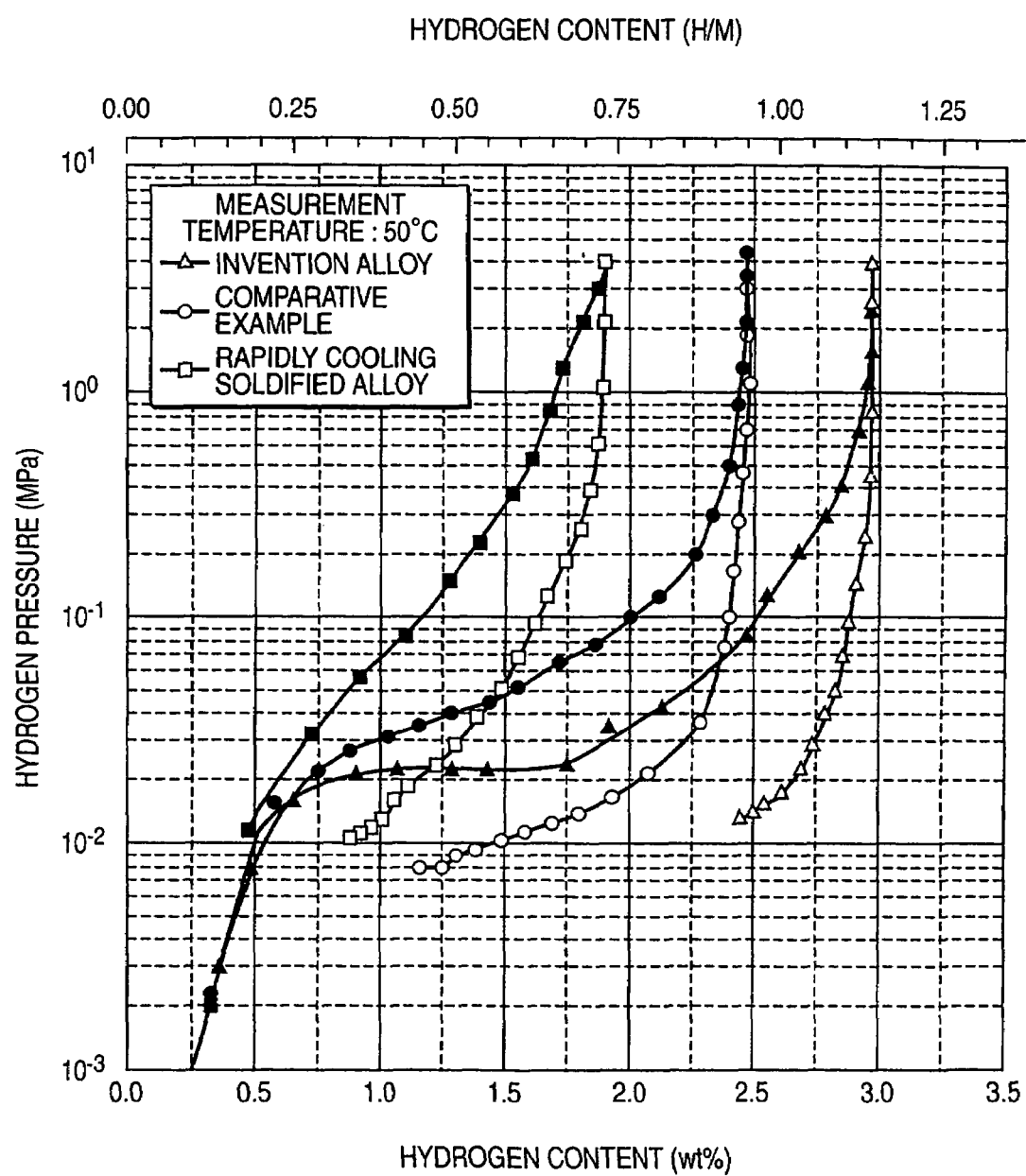

METHOD OF PRODUCING HYDROGEN STORAGE ALLOY

CROSS REFERENCE TO RELATED APPLICATION

This application is a divisional of U.S. application Ser. No. 10/394,274 filed Mar. 24, 2003; the above-noted application incorporated herein by reference.

BACKGROUND OF THE INVENTION

1. Field of the Invention

The present invention relates to methods of producing hydrogen storage alloys used in such applications as hydrogen storage materials, hydrogen absorption materials for use in thermal conversion, hydrogen supply materials for use in fuel cells, negative electrode materials for use in Ni-hydrogen batteries, hydrogen refining and recovering materials, and hydrogen absorption materials for use in hydrogen gas actuators, in particular to methods of producing alloys excellent in their performance under environment temperatures (20 to 80° C.).

2. Related Art

Conventionally, there has been a compressed gas system or liquid hydrogen system as an instrument for storing and transporting hydrogen, however, in place of these methods, a method that uses hydrogen storage alloys has been gaining attention. As is generally known, the hydrogen storage alloys react reversibly with hydrogen and, accompanying the release and absorption of the heat of the reaction, absorb and release hydrogen. By making use of the chemical reaction, a method of storing and transporting hydrogen has been attempted for practical use, and furthermore, by making use of the heat of reaction, technology constituting a heat storage or heat transportation system has been attempted to be developed and put into practical use. As typical hydrogen storage alloys, such as $LaNi_5$, $TiFe$, and $TiMn_{1.5}$ are well known.

In putting various kinds of applications into practical use, the performance of hydrogen storage materials is necessary to be further improved. For instance, an increase in an amount of storable hydrogen, an improvement in the plateau property, and an improvement in the durability can be cited as main problems.

Metals having body-centered cubic structure hereinafter referred to as a BCC structure) such as, for instance, V, TiVMn- and TiVCr-based alloys, have been long since known to be capable of absorbing more hydrogen than $AB_5$ type alloys and $AB_2$ type alloys that have been put into practical use, and are considered to be promising as the hydrogen storage alloys capable of use in the above various kinds of applications.

However, in the hydrogen storage alloys having the BCC structure, an amount of hydrogen that can be effectively absorbed and released is substantially only a half of that based on theory. That is, these alloys are not sufficient in practical use as storage materials.

That is, these kinds of hydrogen storage alloys, including the hydrogen storage alloys having the BCC structure, are mainly produced according to a melting method. According to the method, the homogenization is carried out by applying heat treatment and rapid solidification, however, because of the presence of more or less segregation, precipitates or inclusions, complete homogenization cannot be attained. As a result, there is a drawback in that according to a ratio of the segregation, there is observed deterioration in the plateau property or a decrease in the rechargeable hydrogen capacity.

Furthermore, there is a practical problem in that since repetition of the absorption and release of hydrogen greatly damages the alloy, as the number of the repetition cycles increases, an equilibrium dissociation pressure largely decreases. In particular, there is tendency that in the hydrogen storage alloys having the BCC structure the drawbacks are remarkable.

SUMMARY OF THE INVENTION

According to the present invention, a melt of a hydrogen storage alloy to be finally obtained is gradually cooled at a cooling rate of 5° C./min or less and solidified, alternatively an alloy having an arbitrary composition, after heating to a temperature equal to or more than a melting point thereof, is gradually cooled at a cooling rate of 5° C./min or less and solidified, and thereby a homogeneous alloy can be obtained that is reduced in the amount of segregation, precipitates, or inclusions. Thereby, the invention provides a hydrogen storage alloy exhibiting superior rechargeable hydrogen capacity, plateau property and durability to that of the existing ones.

In order to overcome the problems known in the art, among the methods of producing hydrogen storage alloys according to the present invention, a first aspect of the present invention provides that a melt of a hydrogen storage alloy is solidified with gradually cooling at a cooling rate of 5° C./min or less.

According to a second aspect of the present invention, a hydrogen storage alloy, after heating to a temperature equal to a melting point thereof or more, is cooled gradually at a cooling rate of 5° C./min or less, and thereby homogenizing treatment is applied.

According to the third aspect of the present invention, in the second aspect of the present invention, the hydrogen storage alloy is homogenized by applying the application of the floating zone melting process, where a temperature of a floating zone melting region is in the range of from the melting point to the melting point plus 100° C., and a movement speed of the floating zone melting region is set in the range of from 1 mm/hr to 40 mm/hr.

According to a fourth aspect of the present invention, in the first to third aspect of the present invention, the hydrogen storage alloy has a crystal structure made of a single phase of the BCC structure or a main phase having the BCC structure.

That is, according to the inventions, by cooling a melt gradually at a cooling rate of 5° C./min or less to solidify, alternatively by cooling an alloy, after heating to a temperature equal to or more than a melting point thereof, gradually at a cooling rate of 5° C./min or less to solidify, an homogeneous component composition and the suppression of segregation and precipitates that have not previously been obtained by an alloy manufacture due to the existing melting method can now be obtained. As a result, the plateau property is improved, and, furthermore, a rechargeable hydrogen capacity can be increased. Still furthermore, the deterioration of the alloy due to the repetition of absorption and release of hydrogen and the lowering of the equilibrium dissociation pressure can be suppressed, resulting in an improvement in the durability of the alloy.

When the cooling rate exceeds 5° C./min, the operation cannot be sufficiently obtained; thus, the cooling rate is set at 5° C./min or less.

Furthermore, the cooling control and the homogenization treatment at the production due to the melting method, when adopting one of these, can bring about the desired operations. Accordingly, the invention is not limited by containing both constitutions.

The solidification and the homogenization of the melt, being able to carry out according to an ordinary method except for the control of the cooling rate, can be carried out according to the methods of a vacuum metallurgy, a floating zone melting method and a single crystal growth.

Furthermore, when the homogenization is applied according to the floating zone melting in the third aspect of the present invention, by partially melting the hydrogen storage alloy followed by re-solidifying, the operation due to the gradual cooling can be obtained. Furthermore, in the floating zone melting, inevitable impurities can be excluded outside of the metal, and thereby the inclusions can be suppressed from appearing. Since this obtained alloy has a more uniform component composition, all of the hydrogen absorbing sites can take in hydrogen; that is, a lot of hydrogen can be absorbed and released. Still furthermore, since a flat and large plateau can be obtained owing to the uniform component composition, an amount of effectively absorbable and releasable hydrogen can be increased. Furthermore, since metal defects are suppressed from occurring, the deterioration due to the repetition of the absorption and release of hydrogen can be further diminished, resulting in an improvement in durability.

In the zone melting, in order to obtain a floating zone melting region, a temperature is set at a melting point or greater. On the other hand, when the temperature of a molten body exceeds a melting point plus 100° C., a supply balance collapses due to flowing down of a molten metal, the melt zone becomes difficult to maintain. Accordingly, the temperature of the molten body is preferably set in the range of from a melting point to the melting point plus 100° C. Furthermore, according to the same reason as given above, the temperature of the molten body is more preferably set at a temperature equal to or less than a melting point plus 50° C. Furthermore, a movement speed of the floating zone melting region, in order to exclude the impurities, is necessary to be 1 mm/hr or more. On the other hand, when the movement speed is so large and exceeds 40 mm/hr, the cooling rate of the alloy exceeds 5° C./min, an insufficient homogenization effect results. Accordingly, the movement speed of the floating zone melting region is preferable to be in the range of from 1 mm/hr to 40 mm/hr. Owing to reasons similar to the above, the movement speed is more preferable to be 20 mm/hr or less.

How a hydrogen storage alloy according to the invention can be applied is not particularly restricted in the composition thereof, in the solidification or the homogenization of the molten metal, a molten metal having an arbitrary composition or an alloy having an arbitrary composition can be treated as a target.

As described in the fourth aspect of the present invention, an operation of the invention becomes remarkable particularly in the hydrogen storage alloys having a crystal structure that has a single phase of the BCC structure or a principal phase made of the BCC structure. As ones having a crystal structure that has a principal phase made of the BCC structure, for instance, ones in which crystal having the BCC structure is 15% or more by volume can be cited. As the hydrogen storage alloys having the BCC structure, V, TiVMn-based, TiVCr-based alloys can be cited. However, as the invention, the hydrogen storage alloys having the BCC structure are not restricted to ones illustrated above.

BRIEF DESCRIPTION OF THE DRAWINGS

FIG. 6 is a diagram showing, in comparison, equilibrium hydrogen pressure-amount of hydrogen absorption (release) isotherms in the inventive embodiment according to the invention and comparative embodiment.

DETAILED DESCRIPTION OF THE PREFERRED EMBODIMENTS

The present invention will be described herein below with the reference drawings.

Raw materials are compounded so that a compositional ratio between Ti, V, and Cr maybe 1:1:1. The compounded material is charged in a crucible in a vacuum arc melting furnace, arc-melted under an atmosphere of high-purity argon gas, and thereafter cooled to room temperature in the furnace to solidify.

The melt-produced alloy is set to a floating zone melting furnace as an alloy, the floating zone melting furnace is evacuated to $1 \times 10^{-4}$ Torr or better followed by heating the alloy in a high-purity argon gas atmosphere, and thereby the floating zone melting process is carried out.

Figure 1:
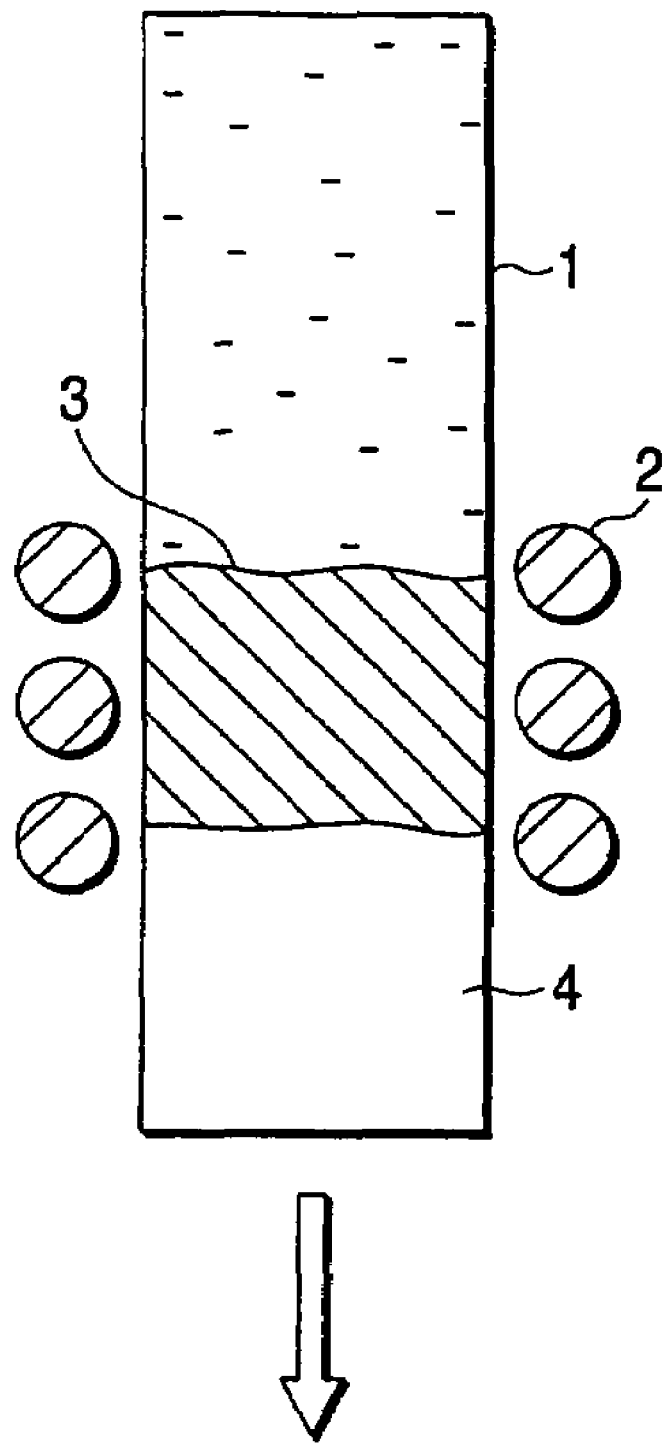
FIG. 1 is a diagram showing a lateral sectional view of a heating zone and an alloy in a floating zone melting furnace used in one embodiment according to the invention.

FIG. 1 is a schematic diagram showing the inside of the floating zone melting furnace. In the drawing, reference numerals 1, 2, 3 and 4 denote an alloy, an induction coil of the floating zone melting furnace, the floating zone melting region and a Refined alloy, respectively.

In the floating zone melting furnace, the alloy 1 is set inside of the induction coil 2, and with the induction coil 2, the floating zone melting region 3 is heated to a temperature in the range of a melting point of the alloy 1 to the melting point plus 100° C. At the heating, the alloy 1 is moved along an axial direction of the induction coil 2 at a movement speed of 1 mm/hr to 40 mm/hr and the floating zone melting region 3 is gradually cooled at a cooling rate of 5° C./min or less, and thereby the alloy 1 is refined and homogenized.

A processed hydrogen storage alloy, as needs arise, after pulverization, can be supplied to various applications. In one embodiment, a case where the homogenization process is applied to the melt-produced hydrogen storage alloy is explained. However, by applying the solidification due to the gradual cooling during the melt-production, the homogenization process may be omitted, or alternatively both processes may be adopted.

PREFERRED EMBODIMENT

In the following, a preferred embodiment according to the invention will be explained in comparison with a comparative example.

In the mode for carrying out the invention, the inside of the floating zone melting furnace is evacuated to $1.0 \times 10^{-4}$ Torr, the floating zone melting region is heated to a temperature of a melting point of the alloy plus 50° C., and a movement speed of the floating zone melting region is set at 20 mm/hr. Under these conditions the floating zone melting process is applied, and thereby an inventive alloy is obtained. Furthermore, to an alloy obtained similarly to the mode for carrying out the invention, the homogenization process is applied at 1450° C. for 60 seconds followed by water-cooling (at a cooling rate of substantially 500° C./s). This obtained alloy is regarded as a comparative alloy.

Figure 2:
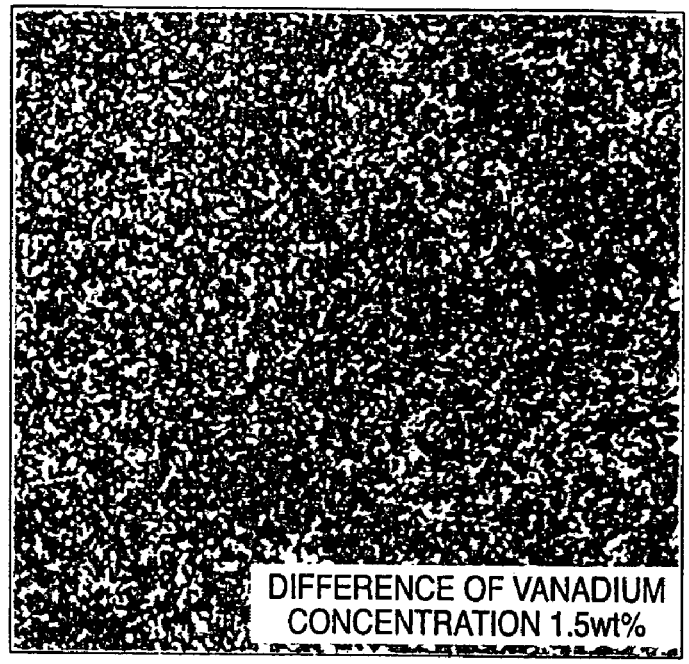
FIG. 2 is a diagram showing an EPMA mapping image showing a state of distribution of vanadium component in the inventive alloy.
Figure 3:
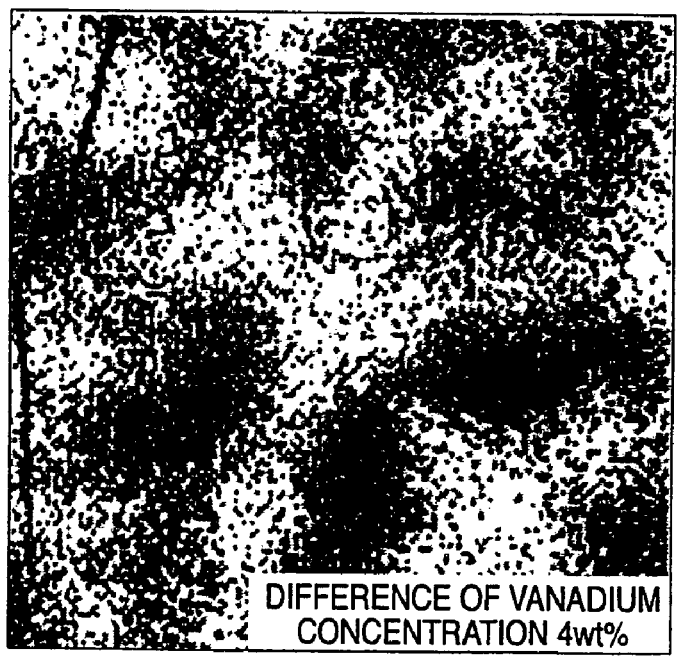
FIG. 3 is a diagram showing an EPMA mapping image showing a state of distribution of vanadium component in the comparative alloy.

In order to investigate distributions of the components in the obtained alloys, by use of the electron probe microanalysis, an electron beam is two-dimensionally scanned, and thereby a mapping image (EPMA mapping image) of vanadium element concentration is obtained. The images of the inventive alloy and the comparative alloy are shown in FIGS. 2 and 3, respectively.

As obvious from these drawings, in the inventive alloy, the concentration distribution of the component is hardly found. That is, owing to the floating zone melting, the component is homogenized, exhibiting hardly no segregation. On the other hand, in the comparative alloy, it is found that the distribution of the vanadium element is conspicuously observed. That is, even after the heat treatment, the segregation still remains.

Figure 4:
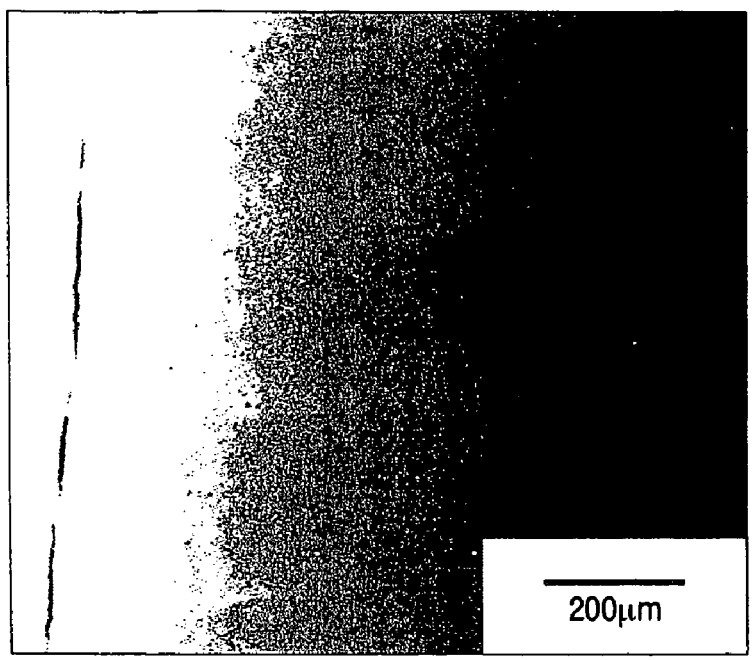
FIG. 4 is a diagram showing a TEM image in the inventive alloy.
Figure 5:
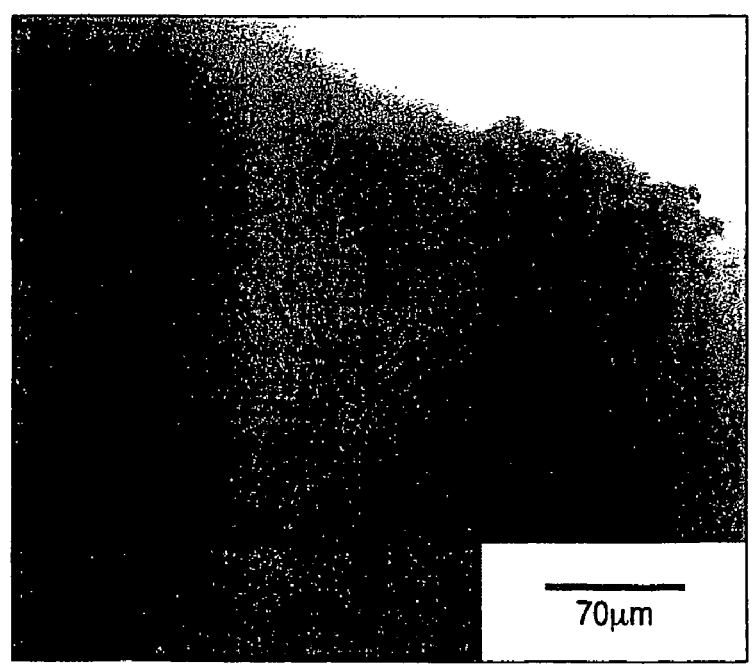
FIG. 5 is a diagram showing a TEM image in the comparative alloy.

Subsequently, in order to investigate the states of presence of defects such as the precipitates, inclusions and dislocation in the obtained alloys, by use of a transmission electron microscope, an electron beam is allowed to pass through a sliced alloy, and thereby a transmitted electron image (TEM image) is obtained. FIGS. 4 and 5 show images of the inventive alloy and the comparative alloy, respectively.

As obvious from these drawings, in the inventive alloy, it is found that contrast that shows the presence of the defects such as precipitates, inclusions and dislocation is hardly found; that is, components refined according to the floating zone melting process are homogenized. On the other hand, in the comparative alloy, contrast that shows the presence of the defects is conspicuously observed.

Furthermore, in order to investigate the hydrogen storage characteristics of the inventive alloy and the comparative alloy, these alloys are pulverized to the range of substantially from 50 to 200 mesh and the hydrogen absorption and release characteristics are measured in a hydrogen gas atmosphere (P (hydrogen pressure)-C (composition)-T (temperature)), and thereby a hydrogen pressure composition isothermal curve is obtained. Still furthermore, as the comparative alloy, other than a sample that is water-cooled, a rapidly cooling solidified alloy that is obtained by melt-producing a material having the same composition as the above by use of a single roll rapidly-solidifying device that is further faster in the cooling rate (1000° C./s or more in the cooling rate) and thereby enabling to do without the homogenizing process is prepared. The hydrogenation properties are measured of these samples.

In FIG. 6, the hydrogenation properties of the inventive alloy, the comparative alloy and the rapidly cooling solidified alloy measured at 50° C. are shown.

As obvious from FIG. 6, in the inventive alloy, owing to the homogenization effect of the component due to the floating zone melting process, an amount of absorbed hydrogen is increased by substantially 20%. Furthermore, the plateau portion is also flattened, and a rechargeable hydrogen capacity is increased. On the other hand, in the comparative alloy and the rapidly cooling solidified alloy, since a content of oxygen becomes very large, a decrease in the amount of absorbed hydrogen and deterioration of the plateau property are confirmed.

As mentioned above, according to the invention, a hydrogen storage alloy having an arbitrary composition, when cooled gradually at a cooling rate of 5° C./minor less, can be homogenized; accordingly, a homogeneous alloy composition can be obtained and the segregation, the precipitates, or the inclusions can be reduced. As a result, a hydrogen storage alloy excellent in the rechargeable hydrogen capacity, in the flatness of the plateau property and in durability can be obtained.

Furthermore, when, at the homogenization, the floating zone melting process is adopted, a temperature of a heating zone of the floating zone melting furnace is set in the range of a melting point to the melting point plus 100° C., and a movement speed is set in the range of 1 mm/hr to 40 mm/hr, a hydrogen storage alloy high in a capacity, much in an amount of absorbable and releasable hydrogen, and excellent in durability at the repetition of absorption and release of hydrogen can be produced.

Still further, when a hydrogen storage alloy having a crystal structure made of a single phase of the BCC structure or mainly of the BCC structure is cooled gradually at a cooling rate of 5° C./min or less, an alloy having a more homogeneous composition than ever can be obtained. Since hydrogen can be taken in intrinsic hydrogen storage sites, a hydrogen storage alloy having a higher capacity can be produced.

What is claimed is:

1. A method of producing a homogenized hydrogen storage alloy comprising the steps of:
   at least partially melting and homogenizing a hydrogen storage alloy in a floating zone melting furnace; and
   gradually cooling at a cooling rate of 5° C./min. or less to thereby solidify and recover a homogenized hydrogen storage alloy.

2. The method of producing a homogenized hydrogen storage alloy as claimed in claim 1, wherein the homogenizing includes:
   setting a temperature of a floating zone melting region in said floating zone melting furnace in the range from a melting point of the hydrogen storage alloy to the melting point plus 100° C.; and
   setting a movement speed of the floating zone melting region in said floating zone melting furnace in the range of from 1 mm/hr to 40 mm/hr.

3. The method of producing a homogenized hydrogen storage alloy as claimed in claim 1, wherein the homogenized hydrogen storage alloy has one of a single phase BCC crystal structure and a main phase having a BCC crystal structure.

4. The method of producing a homogenized hydrogen storage alloy as claimed in claim 2, wherein the homogenized hydrogen storage alloy has one of a single phase BCC crystal structure and a main phase having a BCC crystal structure.

* * * * *